(12) United States Patent  (10) Patent No.: US 7,492,649 B2
Takase  (45) Date of Patent: Feb. 17, 2009

(54) SYSTEMS AND METHODS FOR IMPROVING MEMORY RELIABILITY BY SELECTIVELY ENABLING WORD LINE SIGNALS

(75) Inventor: Satoru Takase, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 11/558,045

(22) Filed: Nov. 9, 2006

(65) Prior Publication Data

US 2008/0112236 A1    May 15, 2008

(51) Int. Cl.
*G11C 7/00*    (2006.01)
(52) U.S. Cl. ............. 365/195; 365/185.23; 365/185.22; 365/189.09
(58) Field of Classification Search ................. 365/195, 365/185.23, 185.22, 189.09
See application file for complete search history.

(56) References Cited

U.S. PATENT DOCUMENTS 6,101,126 A * 8/2000 Chung et al. ........... 365/185.23
6,144,606 A * 11/2000 Pan ............................ 365/226
2008/0062747 A1 * 3/2008 Takase et al. ............... 365/154

* cited by examiner

*Primary Examiner*—Connie C Yoha
(74) *Attorney, Agent, or Firm*—Law Offices of Mark L. Berrier

(57) ABSTRACT

Systems and methods for reducing instability and writability problems arising from relative variations between a memory cell voltage (Vcell) and a logic voltage (Vdd) by inhibiting assertion of word line signals that enable accesses to the memory cells when the voltages are not within an acceptable operating range. One embodiment comprises a system having a critical condition detector configured to monitor the voltages and to determine whether the voltages are within an acceptable range. When the voltages are not within the acceptable range, the system inhibits assertion of the word lines to the memory cells. Memory accesses which fail because of the inhibited word line signals are retried by a memory controller when the critical conditions that caused the signals to be inhibited no longer exist.

16 Claims, 11 Drawing Sheets

SYSTEMS AND METHODS FOR IMPROVING MEMORY RELIABILITY BY SELECTIVELY ENABLING WORD LINE SIGNALS

RELATED APPLICATIONS

This application is related to U.S. patent application Ser. No. 11/530,271, entitled "Systems and Methods for Improving Memory Reliability", by Takase et al., filed Sep. 8, 2006.

BACKGROUND

1. Field of the Invention

The invention relates generally to memory systems, and more particularly to systems and methods for reducing instability and writability problems that arise from relative variations of voltages provided to logic components and memory cells.

2. Related Art

The demand for improved electronic and computing devices continually drives the development of smaller, faster and increasingly efficient devices. As transistors for these devices are scaled down, they may adopt lower operating voltages to allow them to dissipate less power. While this generally does not present problems for much of the logic in a computing device, it may cause problems with the stability and writability of memory cells such as SRAM cells that are used in conjunction with the logic.

One of the ways these stability and writability problems is typically addressed is by using an operating voltage for the memory cells (Vcell) that is slightly higher than the operating voltage of the device's logic components (Vdd). Vcell must be carefully selected, however. If Vcell is too high in comparison to Vdd, the memory cells may be too strong, and a write driver may have difficulty writing new data into the cells. If, on the other hand, Vcell is too low in comparison to Vdd, the memory cells may be too weak, and the data stored in the cells may be corrupted when the cells are read. There is therefore an optimal range for Vcell in comparison to Vdd, such that the stability and writability described above are avoided.

While it may be a relatively straightforward matter to determine the optimal range for the ratio of Vcell to Vdd, there may be variations in these voltages due to operation of the device (e.g. more or fewer components drawing power.) As each of the two operating voltages changes, the ratio between them changes, potentially resulting in the failure of write operations or the corruption of data during read operations.

It would therefore be desirable to provide systems and methods for preventing data corruption during read or write operations in systems that use different voltages for logic components and memory cells.

SUMMARY OF THE INVENTION

One or more of the problems outlined above may be solved by the various embodiments of the invention. Broadly speaking, the invention includes systems and methods for reducing instability and writability problems that arise from relative variations between the voltage at which memory cells operate and the voltage at which logic components that access the memory cells operate by inhibiting assertion of the word lines that enable accesses to the memory cells when the voltages are not within an acceptable operating range.

One embodiment comprises a system having a set of logic components which receive power at a first voltage and a set of memory cells which receive power at a second voltage. The system includes a critical condition detector which is configured to monitor the first and second voltages and to determine whether these voltages are within an acceptable range. When the voltages are not within the acceptable range, the system inhibits assertion of the word lines to the memory cells.

The logic components may, for example, consist of a pipelined processor that issues data access requests to a memory system. The requests may be processed by a memory controller that attempts the requested memory accesses and, if they are not completed because the word line signals for the memory cells were inhibited, the accesses are retried in the same manner as accesses that could not be completed for other reasons. The retries may be scheduled with or without regard to whether the critical conditions that necessitated the retries still exist. The memory accesses may be controlled by selectively inhibiting word line signals in a word line driver. The driver may be configured, for example, to logically AND the conventional word line enable signals with a signal which is asserted when no critical conditions exist. The critical conditions may be defined by acceptable ratios or differences between Vcell and Vdd.

Another embodiment comprises a method including providing power to a set of logic components at a first voltage and to a set of memory cells at a second voltage, determining whether the first and second voltages are within an acceptable range, and enabling or inhibiting word line signals, depending upon whether or not the first and second voltages are within the acceptable range. If the voltages are within the acceptable range, word line signals are enabled. If the voltages are not within the acceptable range, the word line signals are inhibited. The method may be implemented in a system including a memory controller which is configured to selectively inhibit the word line signals. The memory controller may retry accesses that fail as a result of inhibited word line signals in the same manner as other accesses that fail for different reasons.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
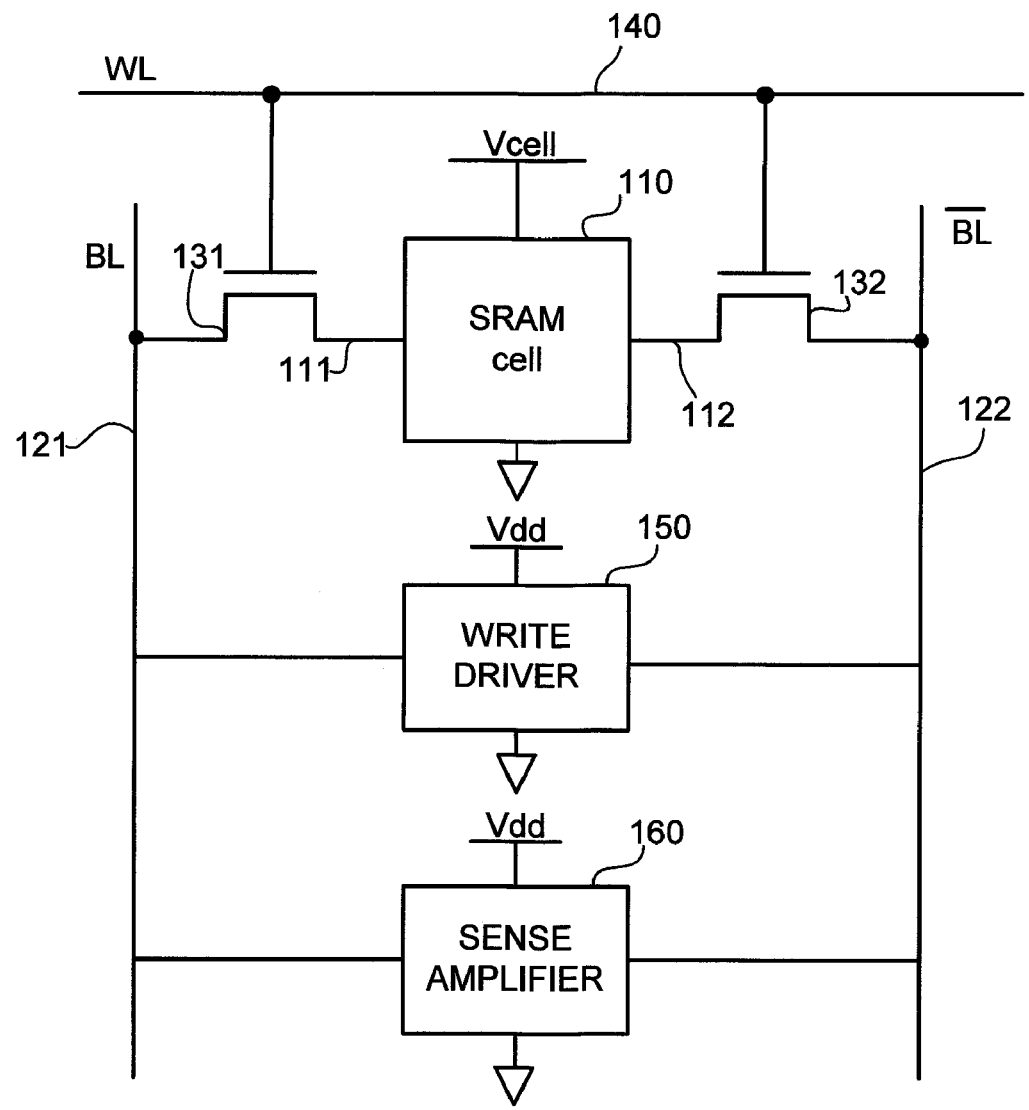
FIG. 1 is a diagram illustrating the interconnection of a memory cell and a corresponding write driver in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for preventing data corruption in systems that use different voltages for logic components and memory cells by monitoring the two voltages and inhibiting memory read and write operations when the ratio of the two voltages is not within an acceptable range.

In one exemplary embodiment, a device comprises a computing system that includes a processor and a memory system. The processor, and possibly the memory system, include logic components which operate using a first operating voltage, Vdd. The memory system, which may be integrated with the processor, comprises SRAM memory cells which are continued to operate using a second operating voltage, Vcell.

A critical condition detector is implemented in the computing device to monitor the respective levels of Vdd and Vcell and to compare these levels to determine if the ratio of Vcell to Vdd is within an acceptable range. If the ratio of Vcell to Vdd is within the acceptable range, operation of the computing device proceeds normally. If, however the ratio of Vcell to Vdd falls outside the acceptable range, the computing device inhibits accesses (e.g., read or write operations) to the SRAM cells.

A critical condition detector is implemented on the die containing the processor and memory cells to monitor the respective levels of Vdd and Vcell and to compare these levels to determine if the ratio of Vcell to Vdd is within an acceptable range. If the ratio of Vcell to Vdd is within the acceptable range, operation of the memory cells proceeds normally. If, however the ratio of Vcell to Vdd falls outside the acceptable range, accesses (e.g., read or write operations) to the SRAM cells is inhibited.

In this embodiment, accesses to the SRAM cells are controlled by a memory controller which is configured to effectively disabling the output of word line drivers when the Vcell/Vdd ratio is too high or too low, so that none of the SRAM cells are selected for the memory accesses that are attempted. When the ratio of Vcell to Vdd returns to the acceptable range, the output of the word line driver is enabled, allowing memory accesses to proceed.

The memory controller is configured to maintain the status of memory access requests. When attempts to access memory cells fail because the word lines were disabled, the failed status is noted by the memory controller, and the accesses are retried. The retries may be scheduled in the same manner as accesses that fail for other reasons (e.g., accesses that timed out,) or these retries may be triggered by the end of the critical condition.

Before describing the invention in detail, it may be helpful to review the cause of the memory stability and writability problems that are intended to be resolved. Referring now to FIG. 1, a diagram illustrating the interconnection of an exemplary SRAM memory cell and a corresponding write driver is shown. SRAM cell 110 is configured to store a data bit at a first node 111 and the inverse of this bit at a second node 112. Node 111 is alternately connected to or disconnected from a bit line 121 by a transistor 131. Similarly, node 112 is alternately connected to or disconnected from a bit line 122 by a transistor 132. Transistors 131 and 132 are switched on or off by a signal on word line 140. Write driver 150 is connected to bit lines 121 and 122, and is configured to drive the bit lines to appropriate voltages during a write operation. Sense amplifier 160 is also connected to bit lines 121 and 122, and is configured to sense differences in the voltages on the respective bit lines and output a corresponding bit value during a read operation.

During a read operation, bit lines 121 and 122 are first pre-charged to a particular voltage which, in this case, is Vdd. The signal on word line 140 is then asserted, switching on transistors 131 and 132. One of nodes 111 and 112 will be high (Vcell) and the other will be low (0), depending upon whether SRAM cell 110 stores a 1 or a 0. Whichever node is high will not substantially affect the voltage on the corresponding one of bit lines 121 and 122. The one of nodes that is low, however, will pull down the voltage on the corresponding one of the bit lines, causing it to be slightly lower than the voltage on the other of the bit lines. Sense amplifier 160 is configured to sense this difference and to output either a 1 or a 0, depending upon which of the bit lines has the lower voltage.

If Vcell is too low with respect to Vdd, SRAM cell 110 may not be strong enough to pull down one of the bit lines, which may prevent the data in the SRAM cell from being properly read. Further, if Vcell is too low with respect to Vdd, the voltage on the bit lines may pull up the voltage of the low one of nodes 111 and 112 enough to cause the voltages on the nodes to flip. The data in SRAM cell 110 would thereby be corrupted. It is therefore important that Vcell not be too low with respect to Vdd, During a write operation, write driver 150 drives one of bit lines 121 and 122 high (to Vdd) and drives the other low (to 0). When the signal on word line 140 is asserted, transistors 131 and 132 are switched on, connecting node 111 to bit line 121 and node 112 to bit line 122. The high one of bit lines 121 and 122 pulls up the voltage of the corresponding node of SRAM cell 110, while the low bit line pulls down the voltage of the other node. When the signal on word line 140 is deasserted, transistors 131 and 132 are switched off, and SRAM cell 110 drives the voltage of the higher-voltage node to Vcell while driving the voltage of the lower-voltage node to 0.

If the data being written to SRAM cell 110 is the opposite of the bit already stored in the cell, the high bit line has to pull up the voltage at the corresponding node of the SRAM cell (and the low bit line has to pull down the voltage at the other node) enough that the relationship of the voltages is inverted. In other words, then node which was previously at 0 now has to be at a higher voltage than the other node. If Vcell is too high with respect to Vdd, however, the bit lines may not be able to pull up (or down) the voltages of the corresponding nodes enough to do this. Put another way, if Vcell is too high, SRAM cell 110 may be too strong to have the new data written into it. It is therefore important that Vcell not be too high with respect to Vdd.

Figure 2:
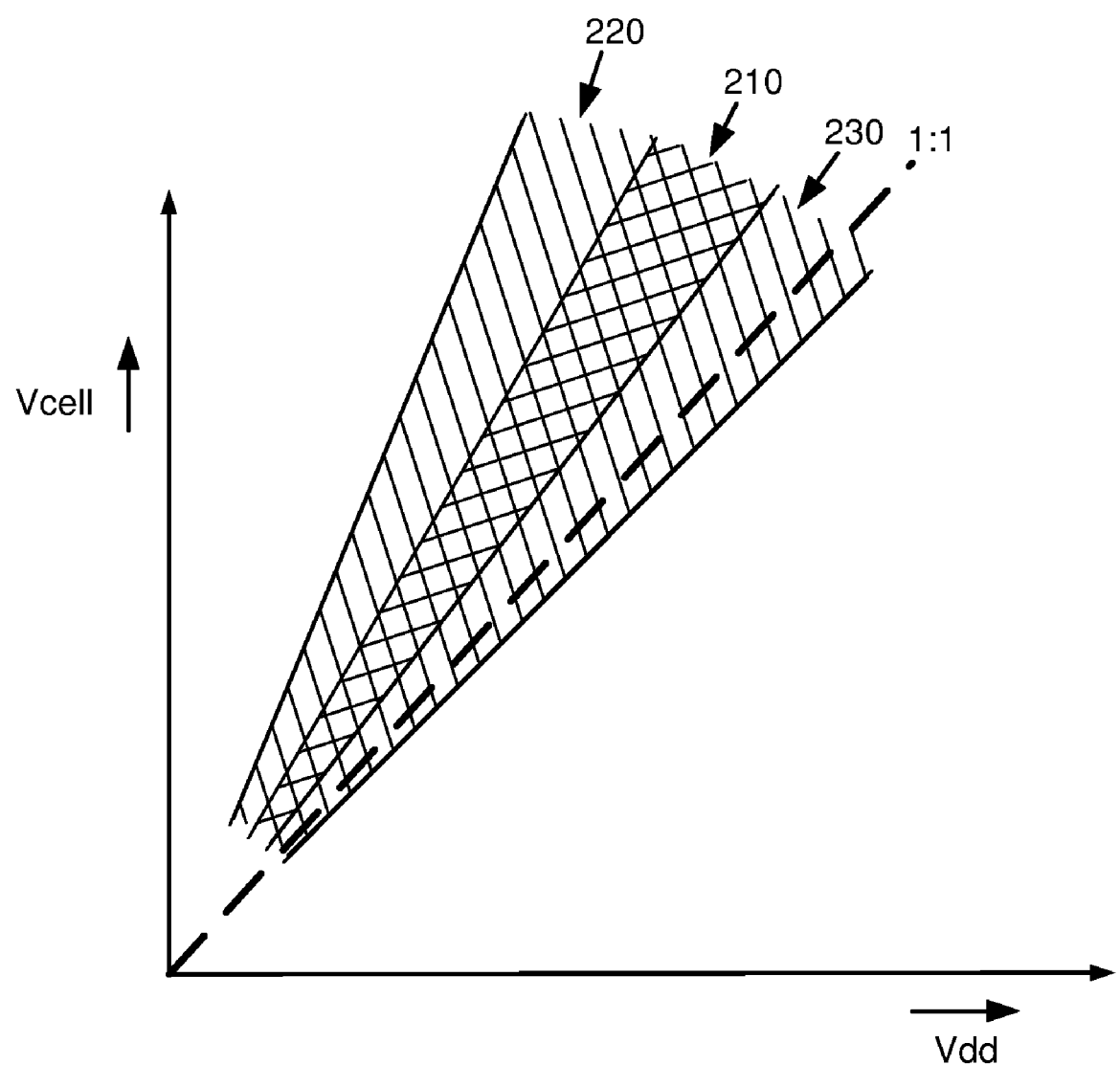
FIG. 2 is a diagram illustrating a desired relationship between the voltage at which memory cells operate (Vcell) and the voltage at which logic components operate (Vdd).

Referring to FIG. 2, a diagram illustrating the desired relationship between Vcell and Vdd is shown. In this figure, Vcell is depicted on the vertical axis, while Vdd is depicted on the horizontal axis. As explained above, it is desirable for the ratio of Vcell to be greater than Vdd, but the ratio of these voltages should not be too high or too low. A desired operating range 210 can therefore be defined (e.g., by choosing an optimal ratio of Vcell to Vdd and setting the limits of the range to +/−10% of this ratio.) It should be noted that the acceptable range of Vcell/Vdd ratios may be wider or narrower, depending upon the particular system and the components used therein. For example, one system might be less tolerant of variations and might therefore need to stay within the range 210, while another system which is more tolerant of variations may be able to operate in the range that also includes 220 and 230.

Figure 3:
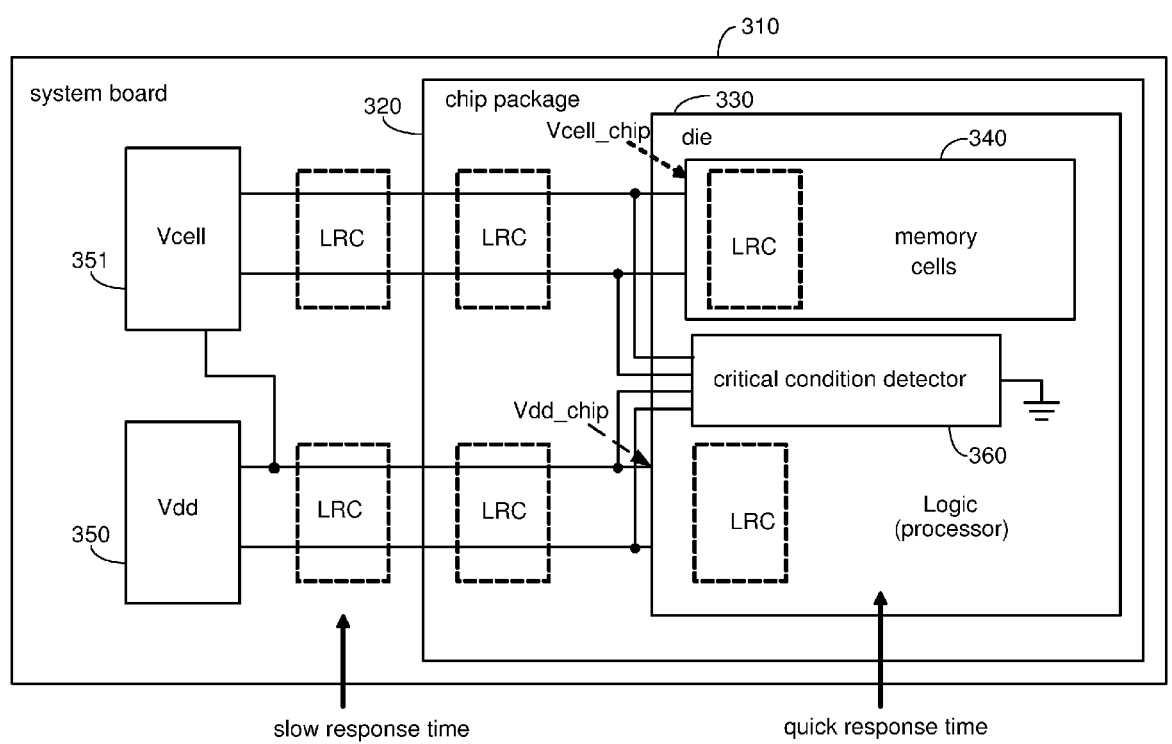
FIG. 3 is a diagram illustrating a computing system in which one embodiment of the invention is implemented.

Referring to FIG. 3, a diagram illustrating a computing system in which one embodiment of the invention is implemented is shown. The computing system includes a system board 310 which has a chip package 320 installed thereon. Within chip package 320 is a die 330 that includes the processor logic, as well as memory cells 340. Various logic components of system board 310, chip package 320 and die 330 are coupled to a voltage regulator 350 that supplies these components with an operating voltage, Vdd. Memory cells 340, and possibly other memory cells within the system, are supplied with an operating voltage, Vcell, by voltage regulator 351.

Voltage regulator 351 is configured to generate voltage Vcell which, although it is greater than Vdd, tracks Vdd. In other words, when Vdd increases, voltage regulator 351 increases Vcell, and when Vdd decreases, voltage regulator 351 decreases Vcell. Typically, voltage regulator 351 cannot immediately compensate for changes in Vdd, so there is a delay between changes in Vdd and the resulting changes in Vcell. As a result, the ratio of Vcell to Vdd varies, and may fall outside the range of values that are deemed to be acceptable.

Figure 4:
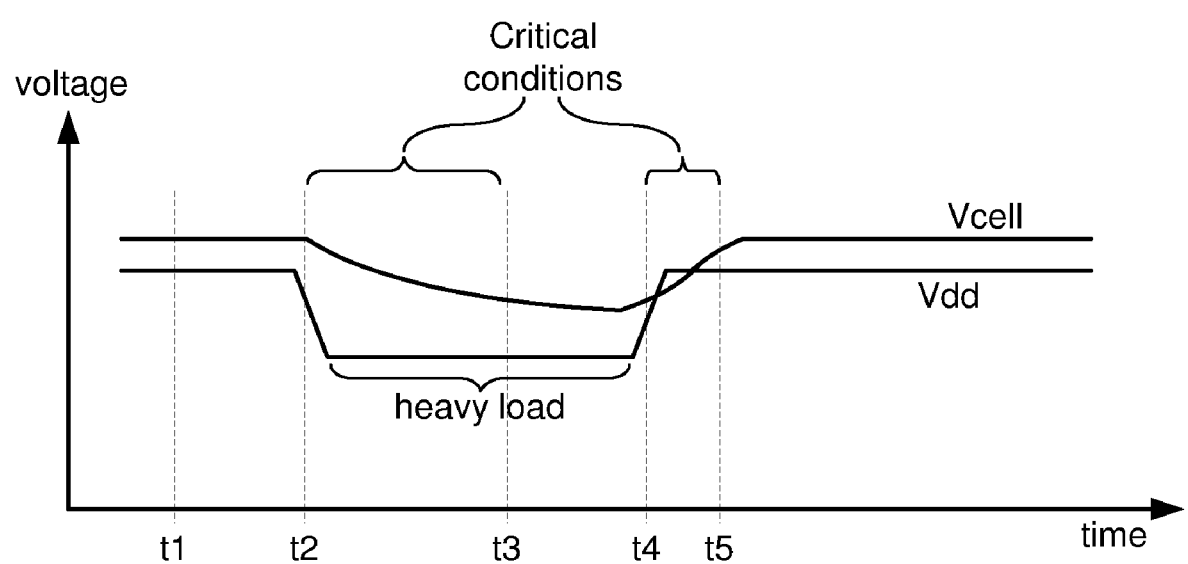
FIG. 4 is a diagram illustrating the relationship of Vcell to Vdd and the existence of critical conditions when the ratio of Vcell to Vdd is outside an acceptable range of values.

The variations in Vcell and Vdd are illustrated in FIG. 4, which is a graph of Vcel and Vdd as a function of time. It can be seen in the figure that, at time t1, Vcell and Vdd have steady values. These values are within the range of acceptable values at which the operation of the memory cells using Vcell can be expected to operate properly. Just before time t2, the loading on voltage regulator 350 increases, causing Vdd to drop. Vcell does not immediately begin to drop, so the difference between Vcell and Vdd increases and, at time t2, causes Vcell/Vdd to exceed a maximum allowable value (a critical condition.) While Vdd stabilizes shortly after time t2, Vcell continues to drop until, at time t3, the ratio Vcell/Vdd is again within an acceptable range. Then, just before time t4, the loading on voltage regulator 350 decreases, causing Vdd to increase. This causes the ratio of Vcell to Vdd to drop, and at time t4, the ratio falls below a minimum acceptable value (another critical condition.) As voltage regulator 351 tries to track Vdd, Vcell increases and, at time t5, the ratio of Vcell to Vdd returns to the acceptable range of values. It should be noted that, in alternative embodiments, voltage regulator 351 may be designed to generate Vcell independent of Vdd, rather than to track the voltage of Vdd. Voltage variations similar to those shown in FIG. 4 may nevertheless occur due to load variations between the logic area using Vdd and the memory area using Vcell.

The computing system of FIG. 3 includes a critical condition detector 360 which is configured to detect critical conditions in which Vcell/Vdd is greater than the maximum allowable value or less than the minimum allowable value. In this embodiment, critical condition detector 360 is implemented on the same die (330) as the processor logic and SRAM cells 340. Critical condition detector 360 is coupled to the power distribution networks on the die through which Vcell and Vdd are supplied to SRAM cells 340 and the processor logic.

FIG. 3 includes several dashed boxes labeled "LRC". These boxes do not represent specific physical components of the system, but instead represent the parasitic inductance (L), resistance (R) and capacitance (C) of the system between the voltage regulators and the memory cells or processor logic. A portion of the parasitic inductance/resistance/capacitance is associated with system board 310, a portion is associated with chip package 320, and a portion is associated with the logic and memory cells on die 330. The effects of the parasitic inductance/resistance/capacitance at the board, package and chip levels are determined by characteristics of board, package and chip, respectively. Typically, the response time of the voltage level outside chip package 320 is slower than the response time of the voltage within die 330. Because the voltages measured at the board level vary more slowly than those measured at the chip level, Vcell and Vdd are measured at the chip level, where they actually affect the operation of the memory cells.

Figure 5:
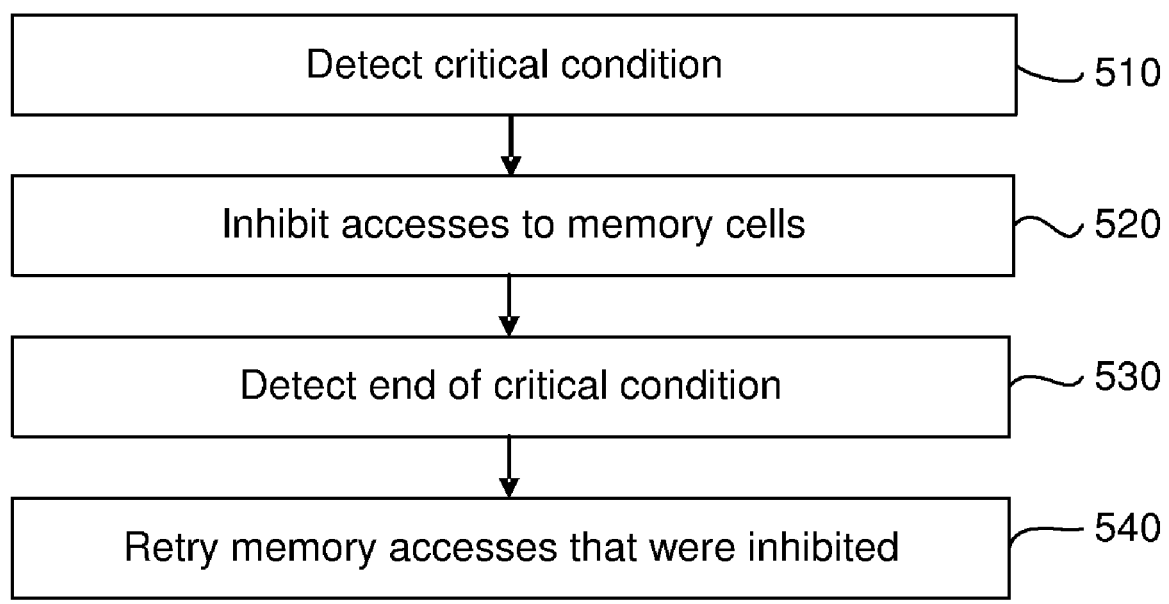
FIG. 5 is a flow diagram illustrating a method in accordance with one embodiment.

The method of operation of a system in accordance with one embodiment is illustrated by the flow diagram of FIG. 5. As depicted in the figure, the method begins with detection of a critical condition (510.) As noted above, this critical condition may be a ratio of Vcell to Vdd that is higher than a maximum threshold or lower than a minimum threshold. When the critical condition has been detected, the operation of the memory cells affected by the critical condition is suspended or otherwise inhibited (520.) As will be explained in more detail below, this is accomplished by preventing assertion of the word line of memory cells that are being accessed. Consequently, the accesses cannot be completed. When it is detected that the critical condition no longer exists (530,) the memory accesses that could not be completed are retried (540) and, assuming there are no errors from other causes, the memory accesses are completed and further accesses are completed normally.

As pointed out above in connection with the embodiment of FIG. 3, a critical condition detector is implemented in the system to determine when a critical condition exists. In one embodiment, a critical condition is deemed to exist when the ratio of Vcell to Vdd is outside a desired range. It should be noted that alternative embodiments may determine whether a critical condition exists based on a voltage difference between Vcell and Vdd, rather than a ratio. The decision to use a ratio or voltage difference may be based on a variety of factors, such as component or circuit characteristics, manufacturing process conditions, and the like.

Figure 6:
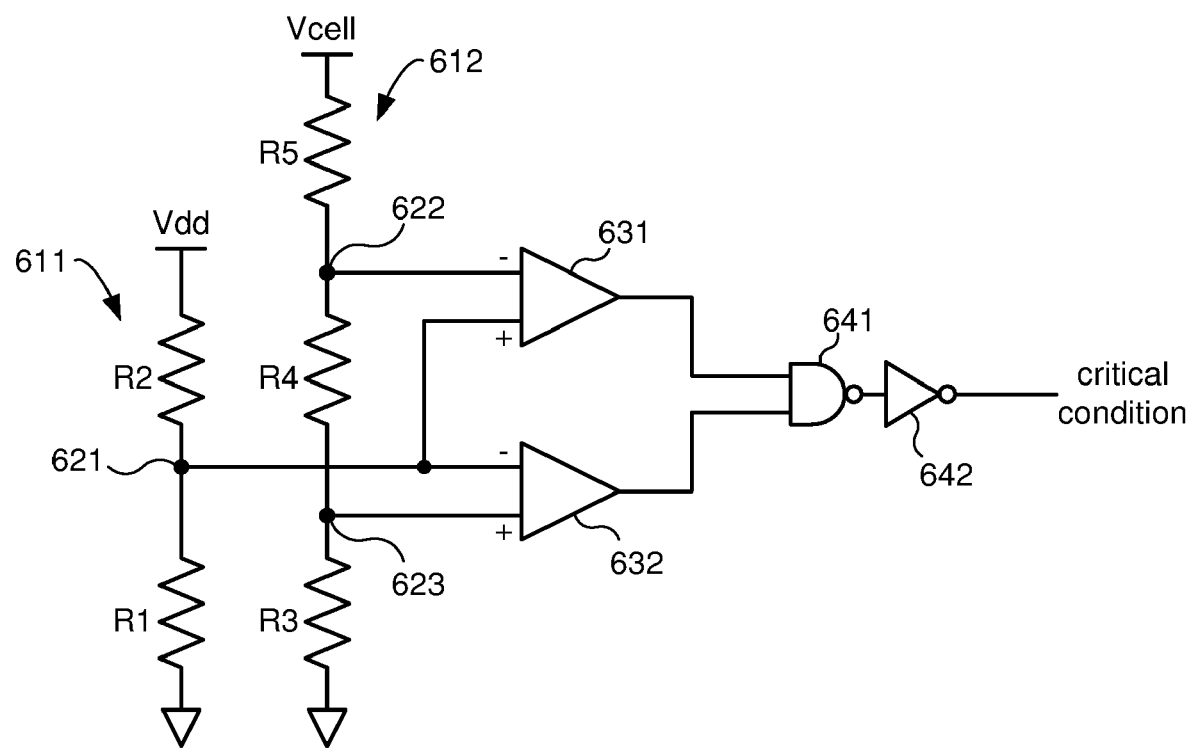
FIG. 6 is a diagram illustrating the structure of a critical condition detector in accordance with one embodiment.

The critical condition detector may be implemented in a variety of ways. An exemplary structure for a critical condition detector is illustrated in FIG. 6. In this embodiment, Vdd is applied across a first series of resistors 611, while Vcell is applied across a second series of resistors 612. The voltage at point 621 in the first series of resistors is provided to each of comparators 631 and 632. A second input of comparator 631 is provided by tapping the voltage at point 622 in the second series of resistors. A second input of comparator 632 is provided by tapping the voltage at point 623 in the second series of resistors. The output of each of comparators 631 and 632 is provided as an input to an OR gate (which, in this case, consists of NOR gate 641 in series with inverter 642.) A critical condition signal is provided at the output of inverter 642.

The critical condition detector of FIG. 6 operates by comparing predetermined percentages of Vcell and Vdd. It can be seen that: the voltage at 621 is R1 /(R1+R2); the voltage at 622 is (R3+R4)/(R3+R4+R5); and the voltage at 623 is R3/(R3+R4+R5). The specific values of the resistors can be chosen so that the voltages at 621, 622 and 623 have the desired ratios. For example, it may be desired to maintain a ratio of Vcell to Vdd which is 1.2±10%. One comparator should therefore be configured to determine when Vcell>1.32 Vdd, and the other comparator should be configured to determine when Vcell<1.08 Vdd. Thus, R3/(R3+R4+R5)=1.32*R1/(R1+R2), and (R3+R4)/(R3+R4+R5)=1.08*R1/(R1+R2). Then, if Vcell/Vdd<1.08, the output of comparator 631 will be asserted, resulting in assertion of the critical condition signal at the output of inverter 642. If Vcell/Vdd is between 1.08 and 1.32, neither the output of comparator 631 nor the output of comparator 632 will be asserted, so the critical condition signal at the output of inverter 642 will not be asserted. Finally, if Vcell/Vdd >1.32, the output of comparator 632 will be asserted, so the critical condition signal at the output of inverter 642 will be asserted.

Figure 7:
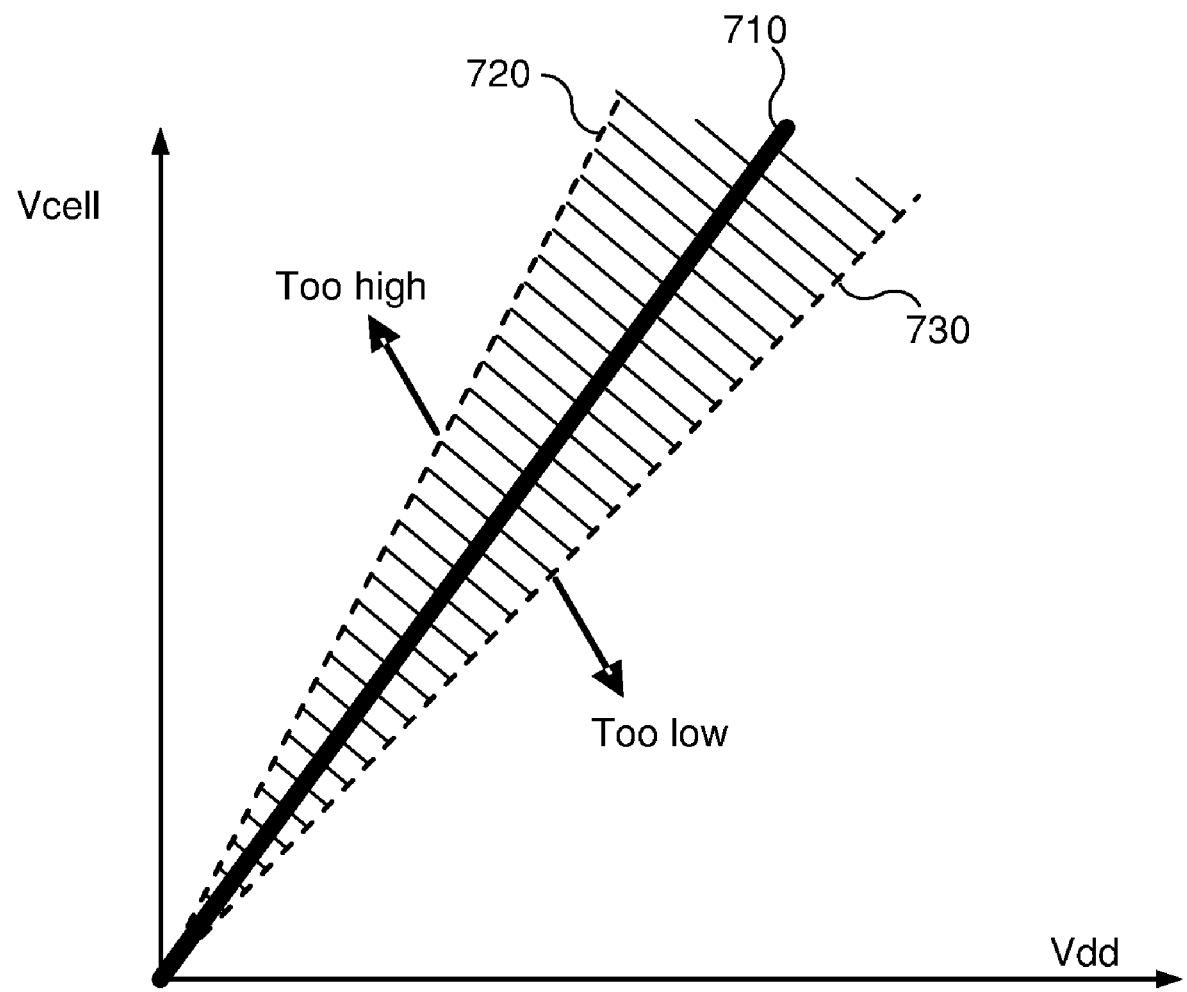
FIG. 7 is a diagram illustrating a desired ratio of Vcell to Vdd and the limits above and below which a critical condition signal will be asserted in accordance with one embodiment.

The operation of the critical condition detector of FIG. 6 is illustrated in FIG. 7. This figure is a diagram illustrating the desired ratio of Vcell to Vdd, as well as the limits above and below which the critical condition signal will be asserted. As in the example above, the desired ratio of Vcell to Vdd is 1.2. This ratio is indicated by line 710. The maximum acceptable ratio of Vcell to Vdd is 1.32, indicated by line 720. The minimum acceptable ratio of Vcell to Vdd is 1.08, indicated by line 730. Thus, if the ratio of Vcell to Vdd falls in the shaded area between lines 720 and 730, the critical condition signal will not be asserted, but if the ratio is above line 720 or below line 730, the critical condition signal will be asserted.

Figure 8:
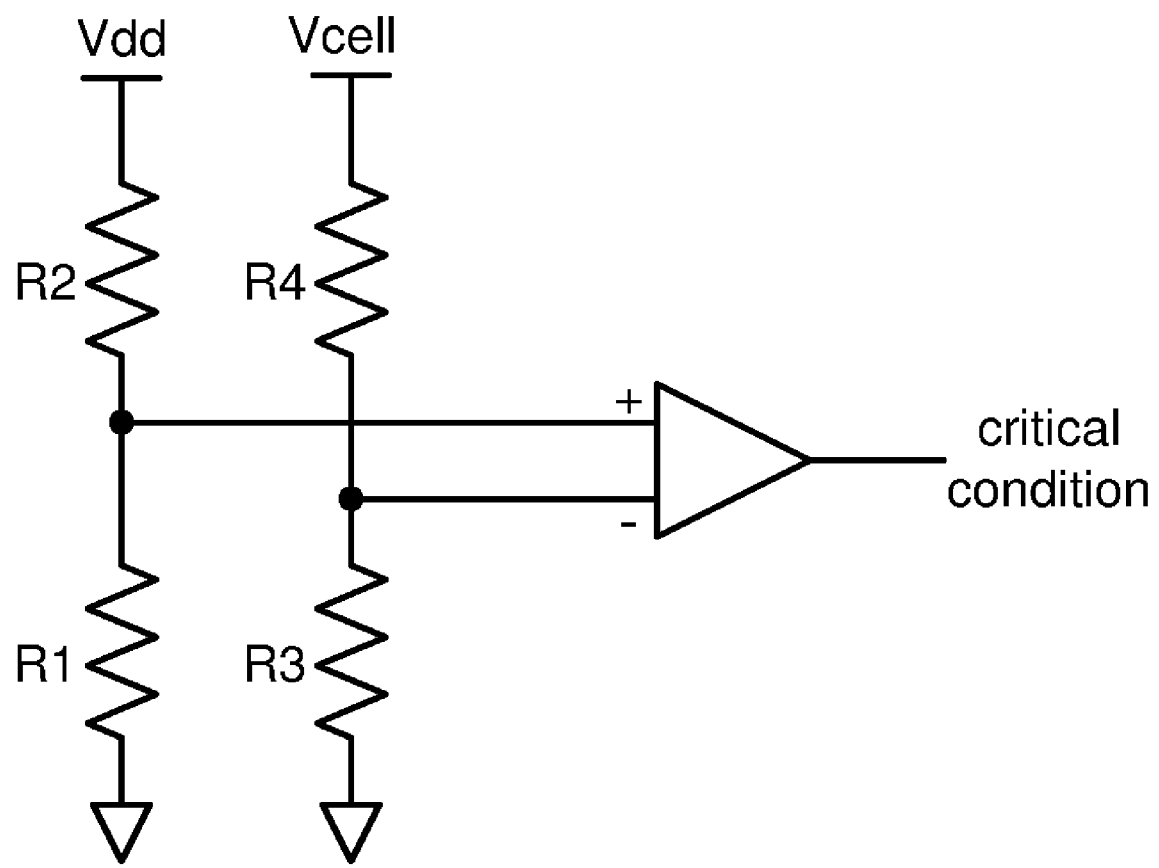
FIG. 8 is a diagram illustrating the structure of a critical condition detector in accordance with an alternative embodiment.

As noted above, acceptable ratios of Vcell to Vdd, differences between Vcell and Vdd, or other measures of critical conditions may be determined in different ways in alternative embodiments. Similarly, the components of the critical condition detector may vary in other embodiments to achieve the desired critical condition detection results. For instance, FIG. 8 illustrates a critical condition detector that detects critical conditions in which the ratio of Vcell to Vdd falls below a minimum threshold, but not conditions in which the ratio exceeds a maximum threshold. Obviously, many other structures are possible, and the examples depicted herein are intended to be merely illustrative of the alternatives.

Figure 9:
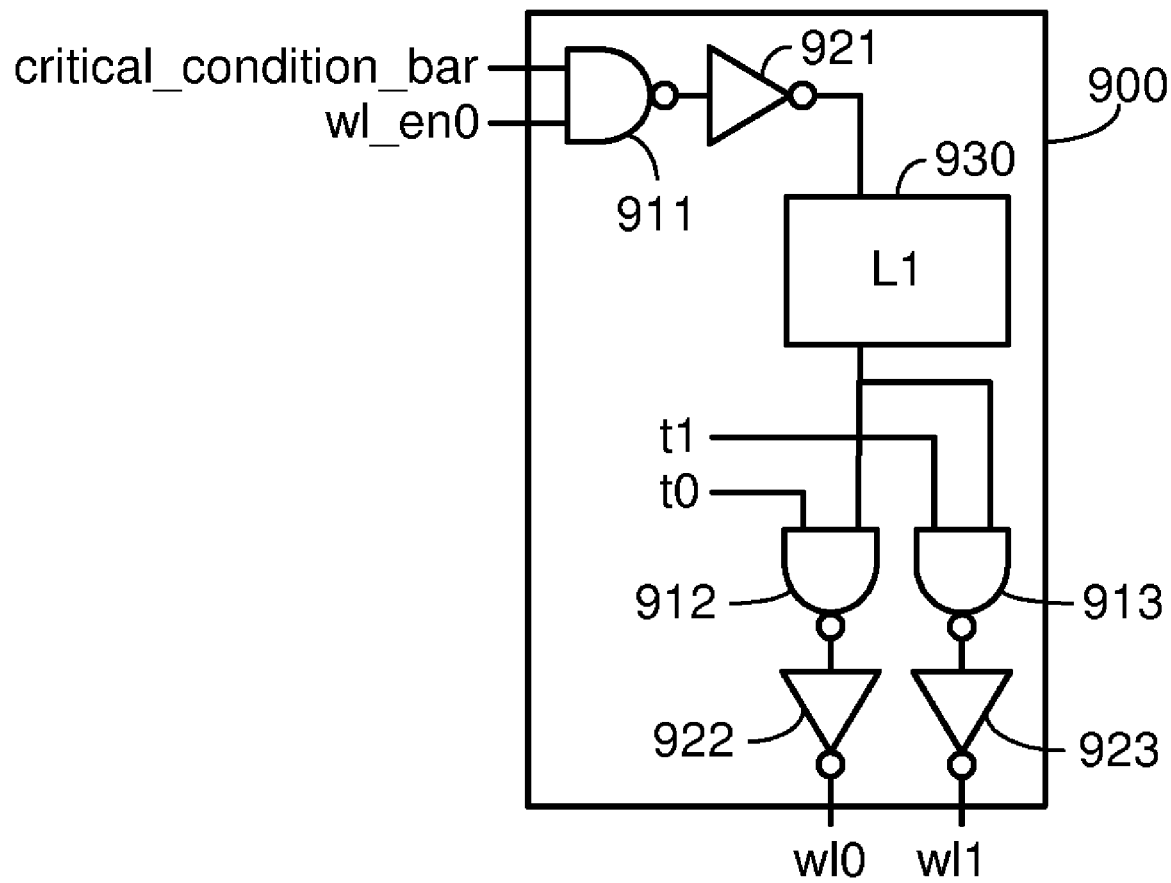
FIG. 9 is a diagram illustrating the structure of a word line driver in accordance with one embodiment.

As pointed out in connection with FIG. 5, when a critical condition has been detected, accesses to the memory cells are prevented. In one embodiment, this is accomplished by controlling the word line so that it is not asserted when there is a critical condition. Referring to FIG. 9, a diagram illustrating the structure of a word line driver configured to control assertion of the word line signal to the memory cells is shown. As depicted in this figure, word line driver 900 includes three NAND gates (911-913,) three inverters (921-923) and a latch (930.) NAND gate 911 receives as inputs a critical condition signal (critical_condition_bar) and a word line enable signal (wl_en0). Signal critical_condition_bar is asserted when a critical condition does not exist (signal critical_condition is asserted when a critical condition exists.) Signal wl_en0 is asserted when the memory cells are selected for an access (read/write) operation.

Viewed in combination, NAND gate 911 and inverter 921 function as an AND gate. Consequently, the output of inverter 921 is asserted when intermediate word line enable signal wl_en0 is asserted and critical_condition_bar is asserted (i.e., when there is an attempted access to the memory cells and no critical condition exists.) The output of inverter 921 is provided to latch 930. The output of latch 930 is then provided as an input to each of NAND gates 912 and 913. Each of NAND gates 912 and 913 also receives a clocking signal (t0 for NAND gate 912 and t1 for NAND gate 913.) The outputs of NAND gates 912 and 913 are provided to inverters 922 and 923, respectively. Again, the combination of a NAND gate followed by an inverter (e.g., 912 followed by 922, or 913 followed by 923) functions as an AND gate, so the signal output by latch 930 is provided that the outputs of inverters 922 and 923 when clock signals t0 and t1, respectively, are asserted.

Conventionally, the word line driver is configured so that word line enable signal wl_en0 is provided directly to the latch, and is then clocked out as the pair of word line signals wl0 and wl1 for a pair of even/odd memory cells. In the present embodiment, word line enable signal wl_en0 is AND'ed with the critical_condition_bar signal so that it will only be passed on to latch 930 when no critical condition exists. When there is a critical condition, signal critical_condition_bar is deasserted, so the input to latch 930 is deasserted, regardless of the state of word line enable signal wl_en0. Consequently, when a critical condition exists, individual word line signals wl0 and wl1 will remain low, and the memory cells will not operate (i.e., cannot be read or written.)

Figure 10:
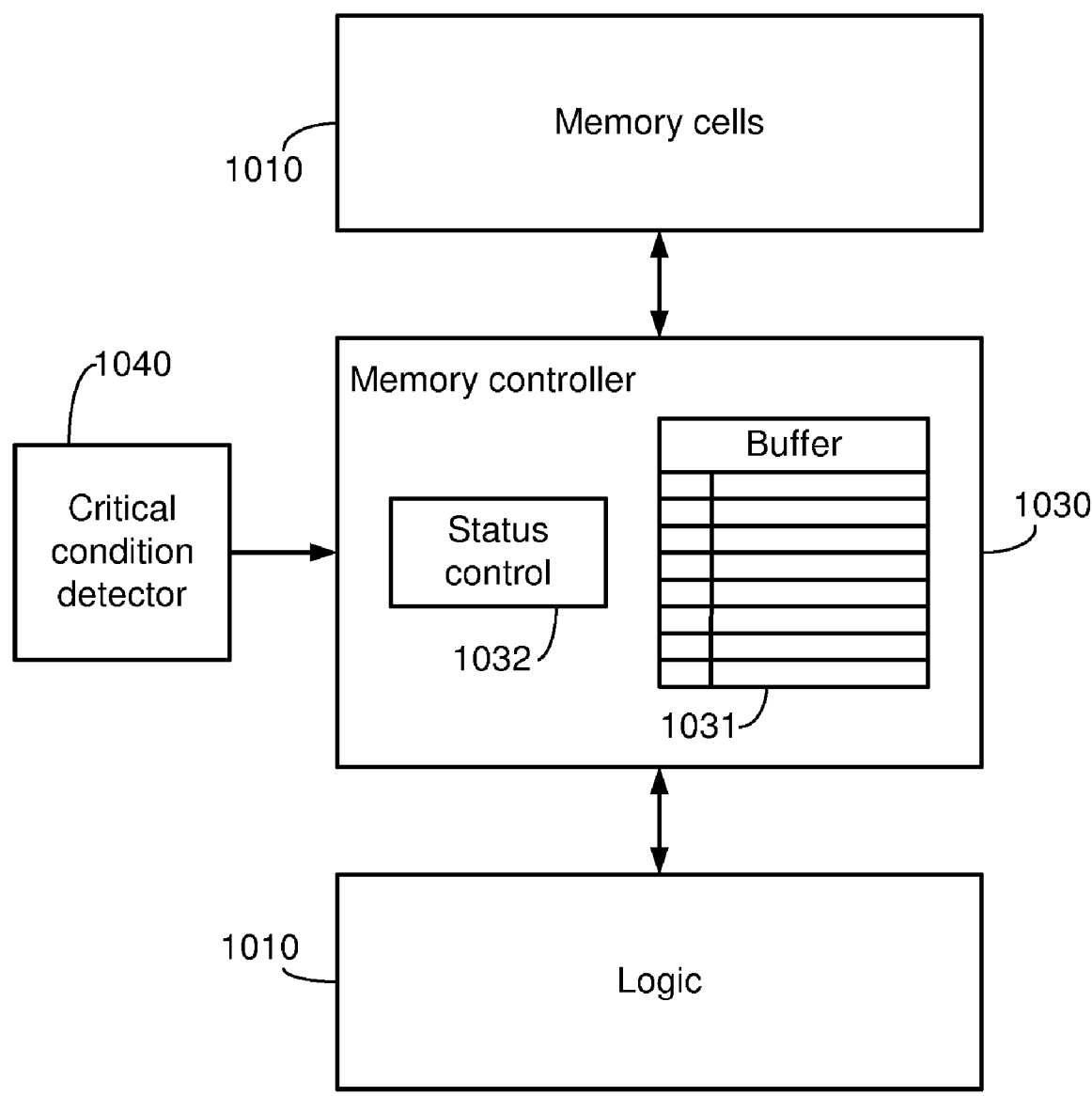
FIG. 10 is a functional block diagram illustrating the structure of a memory system in accordance with one embodiment.

The word line driver of FIG. 9 may be implemented in various memory architectures. Referring to FIG. 10, a diagram illustrating the structure of an exemplary memory system is shown. In this figure, logic 1010 (e.g., a data processor) may make requests to read or write data in memory cells 1020. These requests are forwarded to a memory controller 1030 which is coupled to memory cells 1020 and is configured to control accesses to these memory cells. Memory controller 1030 also receives input from critical condition detector 1040 indicating whether, at a given time, a critical condition exists.

Memory controller 1030 includes a buffer 1031 which is configured to store memory requests received from logic 1010. Memory controller 1030 maintains status information (e.g., status bits) for each of the entries in memory request buffer 1031. A status controller 1032 is implemented in memory controller 1030 to maintain the status information associated with the memory requests in buffer 1031.

When a memory request is received by memory controller 1030, the request is entered into buffer 1031, and the status information for the request is set to indicate that the memory request is pending. At some point, memory controller 1030 will attempt to access memory cells 1020 according to the buffered memory request. (It should be noted that the memory controller may attempt the memory access when the request reaches the head of the buffer, or at an earlier time, depending upon such factors as the design of the memory controller, whether the memory controller can make multiple, concurrent accesses, whether the memory controller is stalled by prior, incomplete accesses, etc.)

If no critical condition exists, the memory access will proceed normally. In one embodiment, for example, memory controller 1030 may update the status information for the request to indicate that the access has been attempted and is pending, then, when the access is completed, the status information may be updated to show that it has been completed, and the request may be retired from buffer 1031 in the conventional manner. If the memory access times out, or if some other error occurs that prevents completion of the memory access, the status information may be updated to indicate that the request remains pending and should be retried at a later time.

If, when memory controller 1030 attempts to access memory cells 1020, a critical condition exists (as indicated by the signal received from critical condition detector 1040,) the word lines to the memory cells will effectively be disabled by a mechanism such as the one illustrated in FIG. 9. As a result, any attempted memory accesses to cells 1020 will be unsuccessful. These unsuccessful attempts will be handled by memory controller 1030 in the same manner as any other unsuccessful attempts to access the memory cells, and the status information for the corresponding requests will be updated to indicate that they should be retried at a later time. These retries will proceed normally and, if a critical condition still exists at the time of the retries, the accesses will be retried again, even later. If the critical condition no longer exists, the retries will proceed normally and, assuming there are no other errors, the corresponding requests in buffer 1031 will be updated to show that they have been completed, and can be retired normally.

Figure 11:
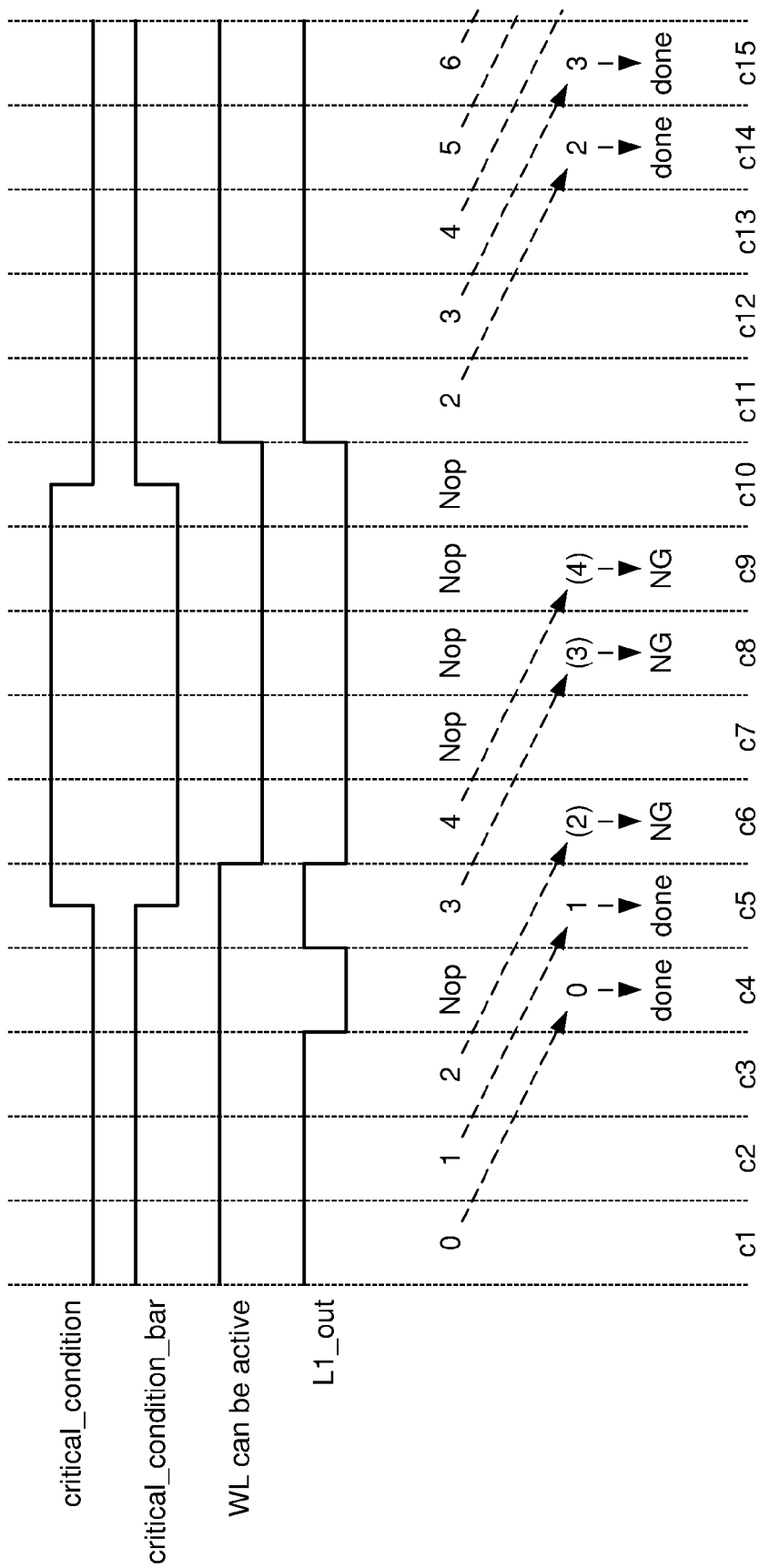
FIG. 11 is a timing diagram illustrating the operation of a memory system in accordance with one embodiment.

The operation of the memory architecture of FIG. 10 is illustrated by the timing diagram of FIG. 11. At the top of FIG. 11, the signals critical_condition, critical_condition_bar and L1_out are shown. Below the signals, a series of memory access requests are shown. The figure shows the time at which memory accesses corresponding to each of the requests is attempted, the time at which the word line for the corresponding memory cells is active, and the status of the attempted access. In the figure, time increases from left to right. Successive clock cycles are numbered at the bottom of the figure.

In the example illustrated by FIG. 11, the system is initially operating with an acceptable ratio of Vcell to Vdd. In other words, no critical condition exists. Accordingly, signal critical_condition is deasserted (low) and signal critical_condition_bar is asserted (high.) Because critical_condition_bar is asserted, the output of the word line driver latch (L1_out) is asserted, and the word lines of the memory cells can be active. This continues from cycle 1 through cycle 4. During cycle 5, a critical condition is detected and, as a result, critical_condition is asserted and critical_condition_bar is deasserted. This may, for example, correspond to times t2 or t4 in FIG. 4. L1_out remains latched high until the end of cycle 5, at which point it is deasserted. Then, during cycle 10, the critical condition is no longer detected (corresponding, for instance, to times t3 or t5 in FIG. 4,) so signal critical_condition is deasserted (and critical_condition_bar is asserted.) Accordingly, signal L1_out remains deasserted until the end of cycle 10, at which time it is again asserted. The word lines of the memory cells can therefore be active beginning with cycle 11, and continuing until another critical condition is detected.

As shown in the figure, a series of memory accesses are attempted, beginning in cycle 1. It is assumed that each attempted memory access requires four cycles. Thus, memory access 0 begins in cycle 1 and completes in cycle 4. It is during cycle 4 that the word line for the accessed memory cells is asserted. Because no critical condition exists in cycle 4, the word line can be active, so the memory access can be completed. When access 0 completes at cycle 4, the status of the accessed is changed to "done". Memory access 1 begins in cycle 2 and continues to cycle 5, with the word line for the corresponding memory cells being asserted in cycle 5. While a critical condition arises during cycle 5, the signal output by the word line driver latch remains asserted until the end of cycle 5. Memory access 1 is therefore completed in cycle 5, and the status of the memory access is changed to "done".

Memory access 2 begins in cycle 3, and would normally continue through cycle 6. As noted above, however, a critical condition arises during cycle 5, so the word lines of the memory cells are disabled beginning at cycle 6, when the word line of the appropriate memory cells would normally have been asserted to complete memory access 2. Because the word lines are disabled at cycle 6, memory access 2 cannot be completed, so the status of this memory access is indicated as "NG" ("no good"). Because the memory access could not be completed, the memory controller retries the access in the same manner as if it were unable to be completed as a result of any other error. Memory accesses 3 and 4, which are attempted beginning in cycles 5 and 6, would normally be completed in cycles 8 and 9, but cannot be completed because the word lines remain disabled due to the existence of the critical condition. These memory accesses are therefore handled in the same manner as memory access 2.

As noted above, the critical_condition signal is deasserted in cycle 10, so the word lines to the memory cells can be active again beginning with cycle 11. In the illustrated example, memory access 2 is retried beginning in cycle 11. When the memory controller reaches the fourth cycle of this memory access (cycle 14) and attempts to assert the word line for the corresponding memory cells, the memory access proceeds normally because the word lines are not disabled by the critical_condition_bar signal. The same is true of memory access 3 and subsequent accesses (until another critical condition is detected.)

It should be noted that the timing of retries by the memory controller may be handled in many different ways which are known in the art. For example, a memory access may be delayed by a first interval after one failed attempt, then a longer interval after a second failed attempt, and so on, up to an allowed number of retries. Alternatively, the memory controller may simply cycle through the entries in the memory access request buffer and attempt, in turn, each memory access that has not yet been successfully completed. In some embodiments, the memory controller may, following detection of a critical condition, delay retries of any memory accesses until the critical condition no longer exists.

The systems and methods described above are intended to be illustrative of the many embodiments of the invention, rather than limiting. For example, as noted above, some embodiments may identify critical conditions based on changes in the ratio of Vcell to Vdd, while others may identify critical conditions based on changes in the difference between Vcell and Vdd. In some embodiments, the timing of accesses, including assertion of critical condition signals, word line signals and the like, may differ from the examples provided above. Further, while the embodiments described above primarily use SRAM cells, alternative embodiments may be implemented with respect to other types of memory cells that have word lines, such as DRAM, NAND-Flash, FeRAM and the like. Alternative embodiments may differ in other ways as well, such as using different circuitry for detecting critical conditions or disabling the memory cells, handling unsuccessful memory access attempts in different ways, scheduling memory access retries differently, and so on.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields, optical fields or particles, and the like. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software (including firmware,) or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
    one or more logic components configured to receive power at a first voltage;
    one or more memory cells configured to receive power at a second voltage; and
    a critical condition detector configured to monitor the first and second voltages and to determine whether the first and second voltages are within an acceptable range by determining whether a ratio of the second voltage to the first voltage is above a minimum threshold and below a maximum threshold;
    wherein the system is configured to inhibit assertion of word line signals corresponding to the memory cells when the critical condition detector determines that the first and second voltages are not within the acceptable range.

2. The system of claim 1, further comprising a word line driver which is coupled to the critical condition detector and the memory cells, wherein the word line driver is configured to receive a critical condition signal, to provide a driver output signal to word lines of the memory cells, and to inhibit assertion of the driver output signal when the critical condition signal indicates that a critical condition exists.

3. The system of claim 2, wherein the critical condition signal is asserted when no critical condition exists and deasserted when the critical condition exists, and wherein the word line driver is configured to logically AND the critical condition signal with an intermediate word line signal to produce the driver output signal.

4. The system of claim 1, further comprising a memory controller which is coupled to the memory cells, wherein the memory controller is configured to attempt accesses to the memory cells, and wherein the memory controller is configured to retry accesses that are not completed due to inhibited word line signals.

5. The system of claim 4, wherein the memory controller is configured to delay retries of accesses until the critical condition detector determines that the first and second voltages are within the acceptable range.

6. The system of claim 1, wherein the critical condition detector is implemented on an integrated circuit die with the logic components and the memory cells.

7. A system comprising:
    one or more logic components configured to receive power at a first voltage;
    one or more memory cells configured to receive power at a second voltage; and
    a critical condition detector configured to monitor the first and second voltages and to determine whether the first and second voltages are within the acceptable range by determining whether a difference between the second voltage and the first voltage is above a minimum threshold and below a maximum threshold;
    wherein the system is configured to inhibit assertion of word line signals corresponding to the memory cells when the critical condition detector determines that the first and second voltages are not within the acceptable range.

8. A system comprising:
    one or more logic components configured to receive power at a first voltage:
    one or more memory cells configured to receive power at a second voltage; and
    a critical condition detector configured to monitor the first and second voltages and to determine whether the first and second voltages are within an acceptable range,
        wherein the critical condition detector includes a first comparator configured to assert a first output signal if the first voltage is greater than a first predetermined percentage of the second voltage,
    a second comparator configured to assert a second output signal if the first voltage is less than a second predetermined percentage of the second voltage, and
    logic configured to assert a critical condition indicator signal if either the first output signal or second output signal is asserted;
    wherein the system is configured to inhibit assertion of word line signals corresponding to the memory cells when the critical condition detector determines that the first and second voltages are not within the acceptable range.

9. The system of claim 1, wherein the memory cells are a type selected from the group consisting of: SRAM cells; DRAM cells; NAND-Flash cells; and FeRAM cells.

10. A method comprising:
providing power to one or more logic components at a first voltage;
providing power to one or more memory cells at a second voltage;
determining whether the first and second voltages are within an acceptable range by determining whether a ratio of the second voltage to the first voltage is above a minimum threshold and below a maximum threshold;
enabling assertion of word line signals to the memory cells when the first and second voltages are within the acceptable range; and
inhibiting assertion of word line signals to the memory cells when the first and second voltages are not within the acceptable range.

11. The method of claim 10, further comprising: providing an intermediate word line signal and a critical condition signal to a word line driver; the word line driver providing the intermediate word line signal to word lines of the memory cells when the critical condition signal indicates that no critical condition exists; and the word line driver not providing the intermediate word line signal to word lines of the memory cells when the critical condition signal indicates that a critical condition exists.

12. The method of claim 11, further comprising the word line driver logically AND's the critical condition signal with the intermediate word line signal.

13. The method of claim 10, further comprising retrying accesses that are not completed due to inhibited word line signals.

14. The method of claim 13, further comprising delaying retries of accesses until the first and second voltages are within the acceptable range.

15. The method of claim 10, further comprising measuring the first and second voltages on an integrated circuit die on which the memory cells are constructed.

16. The method of claim 10, wherein determining whether the first and second voltages are within an acceptable range comprises determining whether a difference between the second voltage and the first voltage is above a minimum threshold and below a maximum threshold.

* * * * *